(12) United States Patent
Oh

(10) Patent No.: US 9,006,813 B2
(45) Date of Patent: Apr. 14, 2015

(54) NONVOLATILE MEMORY DEVICE AND METHOD FOR FABRICATING THE SAME

(71) Applicant: SK Hynix Inc., Gyeonggi-do (KR)

(72) Inventor: Jeong-Seob Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/718,732

(22) Filed: Dec. 18, 2012

(65) Prior Publication Data

US 2014/0061755 A1    Mar. 6, 2014

(30) Foreign Application Priority Data

Aug. 31, 2012  (KR) .................. 10-2012-0096722

(51) Int. Cl.
*H01L 27/00* (2006.01)
*H01L 29/00* (2006.01)
*H01L 29/788* (2006.01)
*H01L 29/66* (2006.01)
*H01L 27/115* (2006.01)

(52) U.S. Cl.
CPC ........ *H01L 29/788* (2013.01); *H01L 29/66825* (2013.01); *H01L 29/7881* (2013.01); *H01L 27/11521* (2013.01)

(58) Field of Classification Search
CPC ................... H01L 27/11521; H01L 29/66825
See application file for complete search history.

(56) References Cited

U.S. PATENT DOCUMENTS

2012/0052674 A1*  3/2012  Lee et al. ............... 438/591
2014/0273495 A1*  9/2014  Kim et al. ............... 438/733

FOREIGN PATENT DOCUMENTS

KR        1020080035915        4/2008

* cited by examiner

*Primary Examiner* — Ngan Ngo
(74) *Attorney, Agent, or Firm* — IP & T Group LLP

(57) ABSTRACT

A nonvolatile memory device includes gate structures formed over a substrate, each gate structure including a tunnel insulating layer, a floating gate, an inter-gate dielectric layer, and a control gate that are sequentially stacked, a protective layer formed on sidewalls of the floating gate, and a second insulating layer covering the gate structures and having an air gap formed between the gate structures, wherein an adhesive strength between the second insulating layer and the protective layer is smaller than an adhesive strength between the second insulating layer and the gate structure.

6 Claims, 4 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0096722, filed on Aug. 31, 2012, which is incorporated herein by reference in its entirety.

BACKGROUND

1. Field

Exemplary embodiments of the present invention relate to a nonvolatile memory device and a method for fabricating the same, and more particularly, to a nonvolatile memory device including an air gap formed between gate structures and a method for fabricating the same.

2. Description of the Related Art

A nonvolatile memory device maintains data stored therein even though power supply is cut off. For example, a NAND flash memory device and the like are widely used.

A conventional memory device includes a plurality of gate structures each having a tunnel insulating layer, a floating gate, an inter-gate dielectric layer, and a control gate which are sequentially stacked. Typically, the floating gate is formed of polysilicon doped with impurities.

However, while a subsequent process is performed after the gate structures are formed, the impurities of the floating gate may not be maintained. For example, the impurities of the floating gate may escape during a subsequent heat treatment, or impurities may be implanted into the floating gate during a subsequent ion implantation. As such, when the impurities of the floating gate are changed, memory cells may have non-uniform characteristics. In this case, a distribution difference between memory cells may increase.

Recently, as the distance between gate structures decreases with the increase in integration degree of nonvolatile memory devices, interference between memory cells has increased.

SUMMARY

Exemplary embodiments of the present invention are directed to a nonvolatile memory device capable of reducing a distribution difference and interference between memory cells and a method for fabricating the same.

In accordance with an embodiment of the present invention, a nonvolatile memory device includes gate structures formed over a substrate, each gate structure including a tunnel insulating layer, a floating gate, an inter-gate dielectric layer, and a control gate that are sequentially stacked, a protective layer formed on sidewalls of the floating gate, and a second insulating layer covering the gate structures and having an air gap formed between the gate structures, wherein an adhesive strength between the second insulating layer and the protective layer is smaller than an adhesive strength between the second insulating layer and the gate structure.

In accordance with another embodiment of the present invention, a nonvolatile memory device includes a gate structure formed over a substrate and including a tunnel insulating layer, a floating gate, an inter-gate dielectric layer, and a control gate that are sequentially stacked, and a protective layer formed on sidewalls of the floating gate configured to block impurities from being transferred from or to the floating gate.

In accordance with yet another embodiment of the present invention, a method for fabricating a nonvolatile memory device includes sequentially forming a tunnel insulating layer, a first conductive layer for a floating gate, an inter-gate dielectric layer, and a second conductive layer for a control gate over a substrate, forming gate structures over the substrate, each gate structure formed by etching the second conductive layer, the inter-gate dielectric layer, and the first conductive layer, and forming a protective layer pattern on at least sidewalls of the etched first conductive layer, the protective layer pattern blocking impurities from being transferred from or to the floating gate.

DETAILED DESCRIPTION

Figure 1:
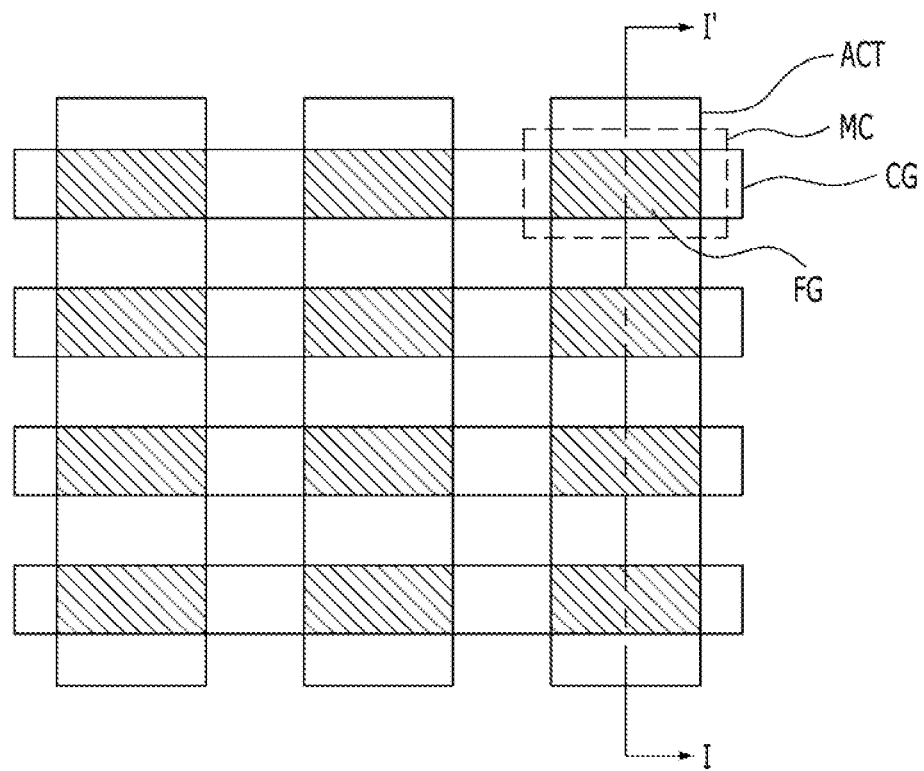
FIG. 1 is a plan view illustrating a nonvolatile memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, 'connected/coupled' represents that one component is directly coupled to another component or indirectly coupled through another component. In addition, a singular form may include a plural form as long as it is not specifically mentioned in a sentence.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIG. 1 is a plan view illustrating a nonvolatile memory device in accordance with an embodiment of the present invention.

Referring to FIG. 1, a plurality of active areas ACT are defined in a substrate. The plurality of active areas ACT are arranged in parallel to each other and extended in one direction (I-I' direction). Over the substrate, a plurality of control gates CG are formed. The plurality of control gates CG are arranged in parallel to each other and extended in a direction crossing the active areas ACT. Between the control gates CG and the active areas ACT, a plurality of island-shaped floating gates FG are formed at the respective intersections between the control gates CG and the active areas ACT. Between the floating gates FG and the substrate, a tunnel insulating layer (not illustrated) is interposed, and between the floating gates FG and the control gates FG, an inter-gate dielectric layer (not illustrated) is interposed. Each of the floating gates FG forms a unit memory cell MC as a charge storing element. Hereinafter a structure in which the tunnel insulating layer, the floating gate FG, the inter-gate dielectric layer, and the control gate CG, which are sequentially stacked, will be referred to as a gate structure.

FIGS. 2 to 6 are cross-sectional views illustrating the nonvolatile memory device and a method for fabricating the same in accordance with the embodiment of the present invention, taken along line I-I' of FIG. 1. First, the fabrication method will be described.

Figure 2:
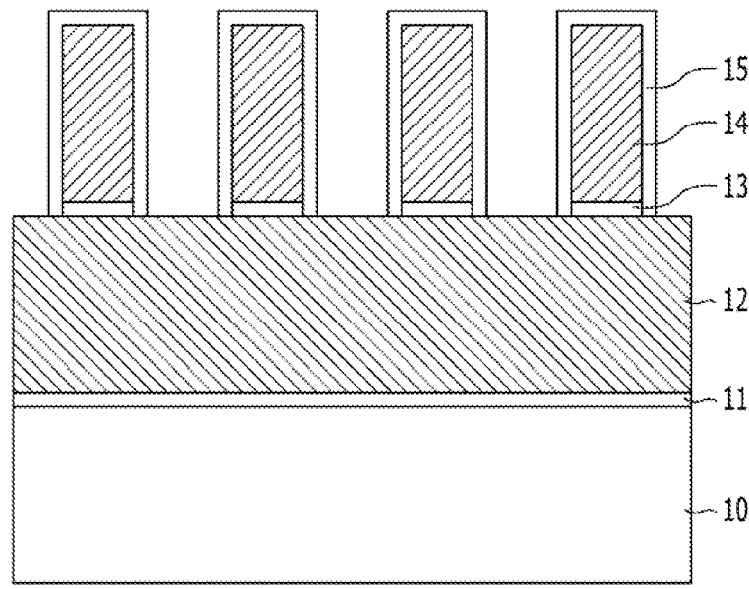
FIGS. 2 to 6 are cross-sectional views illustrating the nonvolatile memory device and a method for fabricating the same in accordance with the embodiment of the present invention.

Referring to FIG. 2, a structure in which a tunnel insulating layer 11 and a floating-gate conductive layer 12 are stacked is formed over a substrate 10.

Such a structure may be formed by the following process. First, an insulating material for forming the tunnel insulating layer 11 and a conductive material for forming the floating-gate conductive layer 12 are deposited on the entire surface of the substrate 10. Then, a mask pattern is formed over the conductive material to cover active areas ACT (refer to FIG. 1). The mask pattern serving as an etch barrier is used to etch the conductive material and the insulating material. Then, the substrate 10 exposed by the etch process is etched to a predetermined depth to form an isolation trench in the substrate 10, thereby defining an active area. Subsequently, the isolation trench is filled with an insulating layer to form an isolation layer (not illustrated). As a result of this process, the tunnel insulating layer 11 and the floating-gate conductive layer 12 may have substantially the same plan shape as the active area of the substrate 10.

The substrate 10 may include a semiconductor substrate such as silicon. The tunnel insulating layer 11 for charge tunneling between the substrate 10 and a floating gate may include oxide, for example. The floating-gate conductive layer 12 serves as a charge storing element, and may include a semiconductor material doped with a required impurity such as phosphorus or boron, for example, polysilicon. However, the present invention is not limited thereto.

Subsequently, an insulating material for forming inter-gate dielectric layers 13 and a conductive material for forming control-gate conductive layers 14 are deposited on the resulting structure, and then selectively etched to form a plurality of control-gate conductive layers 14 and inter-gate dielectric layers 13 that extend in a direction crossing the active areas of the substrate 10. As a result of this process, the control-gate conductive layers 14 may have substantially the same plan shape as the control gates CG of FIG. 1.

The inter-gate dielectric layer 13 serves to block charge transfer between the floating-gate conductive layer 12 and the control-gate conductive layer 14, and may include a triple layer structure such as oxide-nitride-oxide (ONO) layer. However, the present invention is not limited thereto. The control-gate conductive layer 14 may include impurity-doped polysilicon, for example, but the present invention is not limited thereto.

Then, a first insulating layer 15 is formed on the surface of the control-gate conductive layer 14. The first insulating layer 15 serves not only to protect the control-gate conductive layer 14 during a subsequent etch process for the floating-gate conductive layer 12, but also to prevent a protective layer from being formed on the surface of the control-gate conducive layer 14 during a formation process of the protective layer (refer to reference numeral 16 of FIG. 3), because the first insulating layer 15 has a poor adhesion characteristic with respect to the protective layer. The first insulating layer 15 may include oxide, and may be formed by a dry oxidation process or an atomic layer deposition (ALD) process, but the present invention is not limited thereto.

Figure 3:
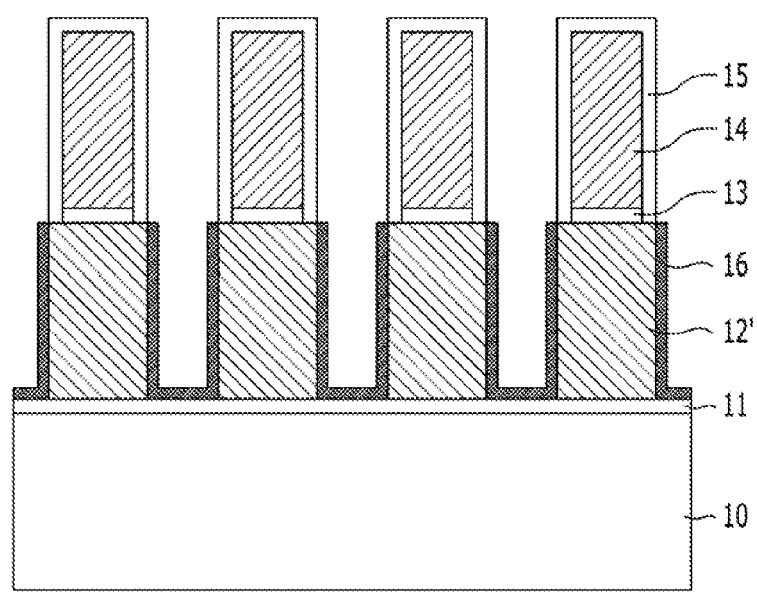

Referring to FIG. 3, the floating-gate conductive layer 14 and the first insulating layer 15 is etched. As a result, a floating gate 12' having an island shape is formed at a position where the control-gate conductive layer 14 and the active area overlap each other.

Then, a protective layer 16 is formed on the sidewalls of the floating gate 12' to prevent impurities from escaping from the floating gate 12' or impurities from being implanted into the floating gate 12'. At this time, the protective layer 16 may include a material capable of blocking transfer of impurities and having a low adhesive strength with respect to a second insulating layer to be described below (refer to reference numeral 18 of FIG. 6). When the second insulating layer includes oxide, the protective layer 16 may include germanium (Ge). Since the protective layer 16 does not adhere to the first insulating layer 15 on the surface of the control-gate conductive layer 14, the protective layer 16 is not formed on the control-gate conductive layer 14, but formed on the sidewalls of the floating gate 12' and the tunnel insulating layer 11. Furthermore, when the adhesion characteristic between the protective layer 16 and the tunnel insulating layer 11 is degraded, for example, when the tunnel insulating layer includes oxide and the protective layer 16 includes Ge, the protective layer 16 may be formed only on the sidewalls of the floating gate 12', but may not be formed on the tunnel insulating layer 11.

The protective layer 16 may be formed by ALD, for example, and may have a thickness of several Å.

Figure 4:
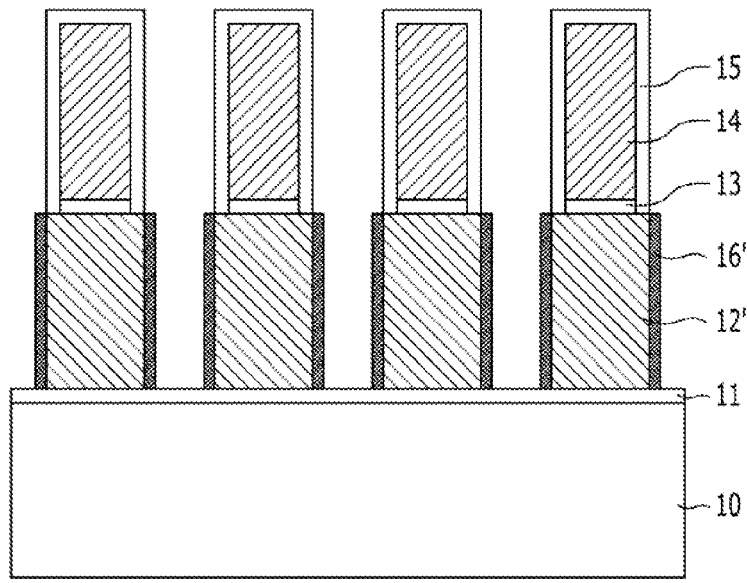

Referring to FIG. 4, the protective layer 16 on the tunnel insulating layer 11 is removed to form a protective layer pattern 16' left only on the sidewalls of the floating gate 12'. This process is performed to form a junction area in the active area of the substrate 10 between the floating gates 12' and to electrically isolate the floating gates 12' from each other. The removal process of the protective layer 16 may be performed by a dry-etch process.

When the protective layer 16 is not formed on the tunnel insulating layer 11, for example, when the protective layer 16 includes Ge and the tunnel insulating layer 11 includes oxide, the process of FIG. 4 may be omitted.

Then, although not illustrated, an ion implantation of impurities such as B or As may be performed to form a junction area in the active area of the substrate 10 between the floating gates 12'. During the ion implantation, since the sidewalls of the floating gate 12' are covered by the protective layer pattern 16', the impurities such as B or As may not be implanted into the floating gate 12'. Furthermore, although a subsequent heat treatment process or the like is performed, the impurities of the floating gate 12' may not escape to the outside.

Figure 5:
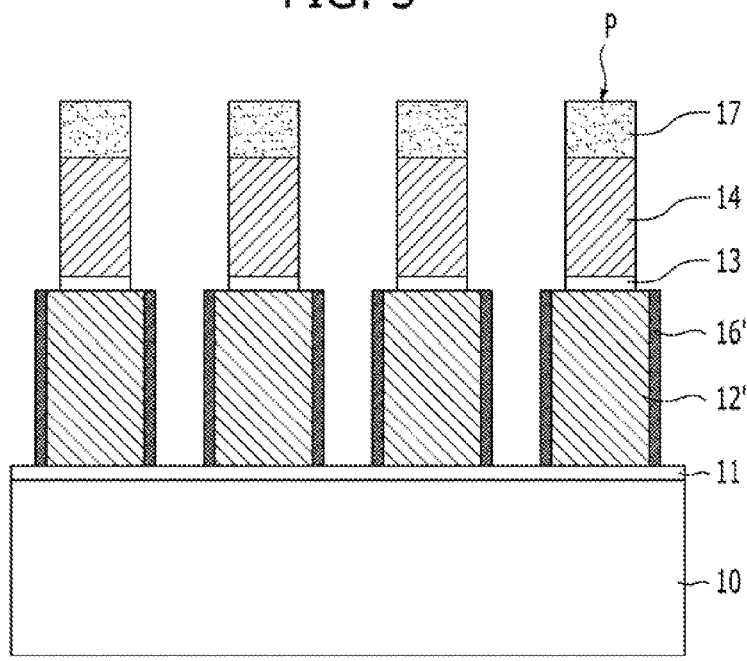

Referring to FIG. 5, the first insulating layer 15 is removed, and a silicide process is performed to transform an upper part of the control-gate conductive layer 14 into a metal silicide layer 17 such as nickel silicide or cobalt silicide, in order to reduce the resistance of the control-gate conductive layer 14. Accordingly, the control-gate conductive layer 14 and the metal silicide layer 17 may form a control gate. The silicide process may be omitted.

As a result of this process, a gate structure P is formed, including the tunnel insulating layer 11, the floating gate 12', the inter-gate dielectric layer 13, and the control gate 14 and 17 that are sequentially stacked.

Figure 6:
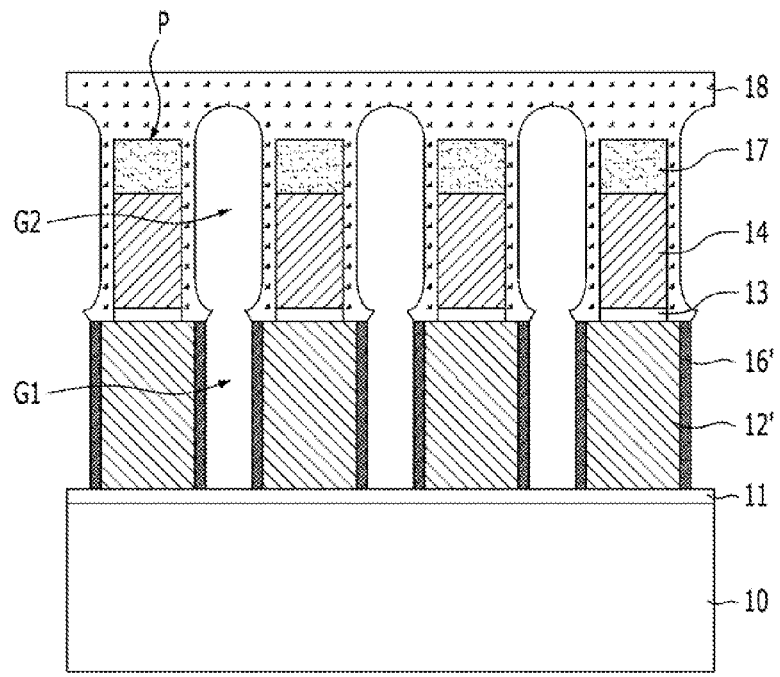

Referring to FIG. 6, a second insulating layer 18 is formed on the structure shown in FIG. 5.

The second insulating layer 18 may include oxide, for example. If the second insulating layer 18 is formed to degrade a step coverage characteristic, for example, if the second insulating layer 18 is deposited by a low pressure (LP) or plasma enhanced (PE) method, the space between the gate structures P may not be filled with an insulating material. In this case, air gaps G1 and G2 may be formed between the gate structures P. Hereinafter, for convenience of description, the air gap G2 disposed between the adjacent control gates 14 and 17 is referred to as an upper air gap G2, and the air gap G1 disposed between the adjacent floating gates IT is referred to as a lower air gap G1.

Here, in order to prevent interference between memory cells, the size of the air gaps G1 and G2 may be increased. In particular, the size of the lower air gap G1 between the floating gates 12 needs to be increased. As described above, however, the protective layer 16 on the sidewalls of the floating gate 12' has a small adhesive strength with respect to the second insulating layer 18. Therefore, the second insulating layer 18 is not formed on the sidewall of the floating gate 12'. Furthermore, the adhesive strength between the second insulating layer 18 and the inter-gate dielectric layer 13 or the control gate 14 and 17, which is not covered by the protective layer 16, is larger than the adhesive strength between the second insulating layer 18 and the protective layer 16. Therefore, the second insulating layer 18 may exist at a predetermined thickness on the sidewalls of the inter-gate dielectric layer 13 and/or the control gate 14 and 17. Since the protective layer 16 has a small thickness of several Å as described above, the protective layer 16 does not have an effect on the size of the lower air gap G1. As a result, the size of the lower air gap G1 between the floating gates 12' may increase.

Through the above-described fabrication method, the device of FIG. 6 may be fabricated.

Referring to FIG. 6, the gate structure P including the tunnel insulating layer 11, the floating gate 12', the inter-gate dielectric layer 13, and the control gate 14 and 17, which are sequentially stacked, is disposed over the substrate 10.

Over the substrate 10 having the gate structure P formed thereon, the second insulating layer 18 is disposed to cover the gate structure P. At this time, since the second insulating layer 18 has a poor step coverage characteristic, the air gaps G1 and G2 are formed between the gate structures P inside the second insulating layer 18.

On the sidewalls of the floating gate 12', the protective layer pattern 16' is formed to prevent impurity transfer of the floating gate 12'. The protective layer pattern 16' has a poor adhesion characteristic with respect to the second insulating layer 18. Therefore, since the second insulating layer 18 is not formed on the protective layer pattern 16', the lower air gap G1 and the protective layer pattern 16' may be directly contacted with each other. As a result, the size of the lower air gap G1 between the floating gates 12' may be increased.

In the nonvolatile memory device and the method for fabricating the same in accordance with the embodiment of the present invention, the material forming the protective layer pattern 16' may be properly controlled during the process for forming the protective layer pattern 16' on the sidewalls of the floating gate 12', thereby preventing impurity transfer of the floating gate 12' and increasing the size of the air gap between the floating gates 12'. As a result, a distribution difference between memory cells and interference between memory cells may be reduced.

In this embodiment of the present invention, the protective layer pattern 16' exists on the sidewalls of the floating gate 12' of the gate structure P, but the present invention is not limited thereto. The protective layer pattern 16' may also be formed on the other part of the gate structure P excluding the floating gate 12'. Hereinafter, the structure will be described in more detail with reference to FIG. 7.

Figure 7:
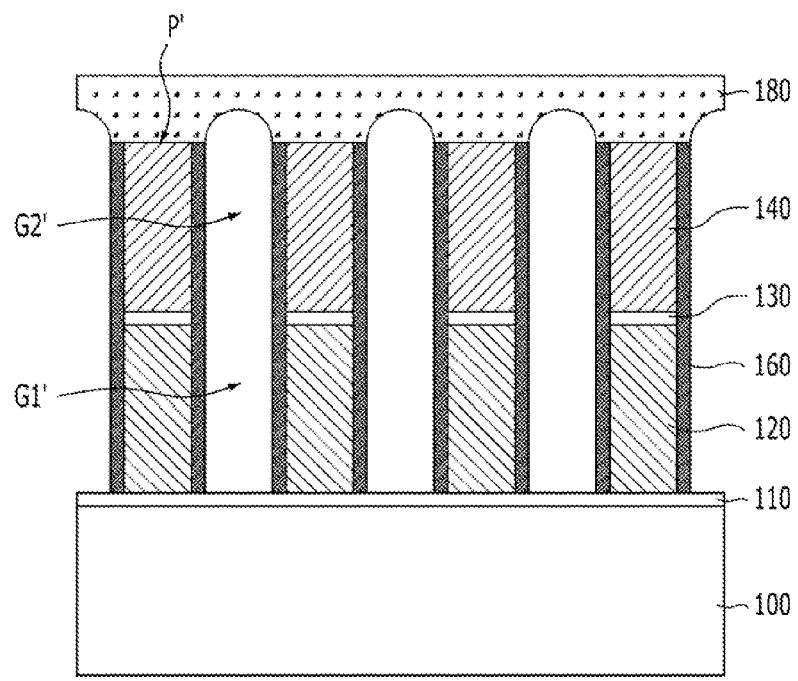
FIG. 7 is a cross-sectional view illustrating a nonvolatile memory device and a method for fabricating the same in accordance with another embodiment of the present invention.

FIG. 7 is a cross-sectional view illustrating a nonvolatile memory device and a method for fabricating the same in accordance with another embodiment of the present invention.

First, the fabrication method will be described, and the duplicated descriptions of the above-described embodiment will be omitted herein.

Referring to FIG. 7, a gate structure P' including a tunnel insulating layer 110, a floating gate 120, an inter-gate dielectric layer 130, and a control gate 140, which are sequentially stacked, is formed over a substrate 100.

The gate structure P' may be formed by the following process: the etch process for forming the inter-gate dielectric layer 13 and the control-gate conductive layer 14 in the process of FIG. 2 is performed and the floating-gate conductive layer 12 is then etched without the process for forming the first insulating layer 15. That is, the floating gate 120, the inter-gate dielectric layer 130, and the control gate 140 may be formed by one etch process using the same mask.

Then, a protective layer pattern 160 having a small adhesive strength with respect to the second insulating layer 180 is formed on the sidewalls of the gate structure P' to prevent impurity transfer. The protective layer pattern 160 may be formed by depositing a protective layer along the entire surface of the resulting structure having the gate structure P' formed therein and then performing a dry-etch process to expose the tunnel insulating layer 110. During the dry-etch process for the tunnel insulating layer 110, the protective layer deposited on the top surface of the gate structure P' may be removed. Accordingly, the top surface of the gate structure P' may be exposed.

Subsequently, a second insulating layer 180 is formed on the resulting structure having the gate structure P' and the protective layer pattern 160 formed therein. In this case, since the protective layer pattern 160 having a poor adhesion characteristic with respect to the second insulating layer 180 is positioned on the sidewalls of the gate structure P', the second insulating layer 180 may be mainly formed over the gate structure P', and air gaps G1' and G2' may be positioned in the entire space between the gate structures P' to expose the protective pattern 160. Although not illustrated, a process for silicidizing an upper part of the control gate 140 may be additionally performed before the second insulating layer 180 is formed.

Through the above-described fabrication method, the device of FIG. 7 may be fabricated.

Referring to FIG. 7, the device in accordance with this embodiment of the present invention is different from the above-described embodiment in that the protective layer pattern 160 is positioned on the entire sidewalls of the gate structure P' including the floating gate 120.

In short, the protective layer pattern 160 is formed on the sidewalls of the floating gate 120, in order to prevent impurity transfer of the floating gate 120 and prevent interference between the floating gates 120. However, the protective layer pattern 160 may or may not be formed on the other part of the gate structure P'. In this embodiment of the present invention, the protective layer pattern 160 may be formed on the entire sidewalls of the gate structure P'. However, the protective layer pattern 160 may be formed on a part of the sidewalls of the gate structure P', or formed on a part or all of the top surface of the gate structure P'.

In accordance with the embodiment of the present invention, a distribution difference and interference between memory cells may be reduced.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   gate structures formed over a substrate, each gate structure comprising a tunnel insulating layer, a floating gate, an inter-gate dielectric layer, and a control gate that are sequentially stacked;
   a protective layer formed on sidewalls of the floating gate; and
   a second insulating layer covering the gate structures and having an air gap formed between the gate structures, wherein an adhesive strength between the second insulating layer and the protective layer is smaller than an adhesive strength between the second insulating layer and the gate structure.

2. The nonvolatile memory device of claim 1, wherein the protective layer blocks impurities from being transferred from or to the floating gate.

3. The nonvolatile memory device of claim 1, wherein the protective layer comprises germanium (Ge).

4. The nonvolatile memory device of claim 3, wherein the second insulating layer comprises oxide.

5. The nonvolatile memory device of claim 1, wherein the protective layer and the air gap are directly contacted with each other.

6. The nonvolatile memory device of claim 1, wherein the protective layer is further formed on a part or all of the gate structure.

* * * * *